(12) United States Patent
Rabii (10) Patent No.: US 6,304,136 B1
(45) Date of Patent: Oct. 16, 2001

(54) REDUCED NOISE SENSITIVITY, HIGH PERFORMANCE FM DEMODULATOR CIRCUIT AND METHOD

(75) Inventor: Shahriar Rabii, Palo Alto, CA (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/261,668

(22) Filed: Mar. 3, 1999

(51) Int. Cl.⁷ ..................................... H03D 3/00
(52) U.S. Cl. .................. 329/300; 329/304; 329/318; 375/324; 375/334
(58) Field of Search .................. 329/318, 320, 329/300, 304; 375/324, 334

(56) References Cited

U.S. PATENT DOCUMENTS

| | | |
|---|---|---|
| 3,909,599 | 9/1975 | Trott, Jr. et al. . |
| 4,035,736 | 7/1977 | Lance et al. . |
| 4,365,204 | 12/1982 | Haque . |
| 4,471,321 | 9/1984 | Bowers . |
| 4,757,274 | 7/1988 | Bowers . |
| 5,079,513 | * 1/1992 | Noguchi et al. ................ 329/304 |
| 5,138,277 | 8/1992 | Robinson et al. . |
| 5,438,692 | * 8/1995 | Mohindra ........................ 455/324 |
| 5,479,130 | 12/1995 | McCartney . |
| 5,479,578 | 12/1995 | Engeler . |
| 5,748,036 | 5/1998 | Lee et al. . |
| 5,796,787 | 8/1998 | Chen et al. . |
| 5,805,017 | 9/1998 | Razzell . |
| 6,005,506 | * 12/1999 | Bazarjani et al. .............. 341/143 |

FOREIGN PATENT DOCUMENTS

| | | |
|---|---|---|
| 42 41 965 C1 | 5/1994 | (DE) . |
| 0 314 208 A1 | 5/1989 | (EP) . |

* cited by examiner

Primary Examiner—Robert Pascal
Assistant Examiner—Kimberly E Glenn
(74) Attorney, Agent, or Firm—Merchant & Gould P.C.

(57) ABSTRACT

An FM demodulator circuit with reduced sensitivity to noise and performance nearly identical to theoretical predictions. The FM demodulator is a time sampled detector for binary shift key (BFSK) modulated signals. Its inputs are an in-phase and a quadrature outputs of a receiver, which have been oversampled by a predetermined factor with respect to the data rate. The demodulator circuit differentiates the in-phase and the quadrature input signal by computing the difference between the current signal value and the signal value delayed by one clock period. The differentiated values of the in-phase and the quadrature signals may be changed based on the sign of the quadrature and the in-phase signals respectively to produce modified values of the differentiated in-phase and quadrature signals. Processing of the modified differentiated in-phase and quadrature values to produce an output wherein the sensitivity to noise is reduced by discarding the smaller of the modified differentiated in-phase or quadrature signal. The resulting output signal is filtered and passed through a comparator to produce a digital waveform.

24 Claims, 6 Drawing Sheets

REDUCED NOISE SENSITIVITY, HIGH PERFORMANCE FM DEMODULATOR CIRCUIT AND METHOD

BACKGROUND OF THE INVENTION

1. Field of the Invention

This invention relates in general to an FM demodulator, and more particularly to an FM demodulator circuit and method that has a reduced sensitivity to noise which enhances the performance of a system.

2. Description of Related Art

Today's wireless communications markets are being driven by a multitude of user benefits. Products such as cellular phones, cordless phones, pagers, and the like have freed corporate and individual users from their desks and homes and are driving the demand for additional equipment and systems to increase their utility. As a result digital radio personal communications devices will play an increasingly important role in the overall communications infrastructure in the next decade.

Mixed-signal integration and power management have taken on added importance now that analog and mixed analog-digital ICs have become the fastest-growing segment of the semiconductor industry. Integration strategies for multimedia consoles, cellular telephones and battery-powered portables are being developed, as well as applications for less integrated but highly specialized building blocks that serve multiple markets. These building blocks include data converters, demodulators, filters, amplifiers and voltage regulators.

One important aspect of digital radio personal communications devices is the integration of the RF sections of transceivers. Compared to other types of integrated circuits, the level of integration in the RF sections of transceivers is still relatively low. Considerations of power dissipation, form factor, and cost dictate that the RF/IF portions of these devices evolve to higher levels of integration than is true at present. Nevertheless, there are some key barriers to realizing these higher levels of integration.

For example, most applications provide an FM demodulator in an RF receiver system to recover transmitted data from a carrier signal. For FM demodulators, robust performance requires a bit error rate (BER) performance close to the theoretical performance limit. However, this requires the implementation of circuitry which reduces the demodulator's sensitivity to noise.

It can be seen then that there is a need for an FM demodulator circuit method with reduced sensitivity to noise that provides a low bit error rate and performance.

SUMMARY OF THE INVENTION

To overcome the limitations in the prior art described above, and to overcome other limitations that will become apparent upon reading and understanding the present specification, the present invention discloses an FM demodulator circuit and method providing reduced sensitivity to noise which enhances the performance of a system almost identically with the theoretical predictions for an ideal demodulator.

The present invention solves the above-described problems by providing an FM demodulator circuit which reduces sensitivity to noise by reducing the bit error rate and enhancing the performance of the system.

A system in accordance with the principles of the present invention includes a discrete-time sampled detector for a binary frequency shift key (BFSK) modulated signal. The sampled waveform is provided by an in-phase (I) signal and a quadrature (Q) signal output of the receiver, which have been oversampled by a factor of four with respect to a data rate. The function of the demodulator is to sense a direction of rotation of an I/Q signal constellation in a Q vs. I plane and to generate an appropriate digital output.

Other embodiments of a system in accordance with the principles of the invention may include alternative or optional additional aspects. One such aspect of the present invention is that the system includes a time sampling detector which implements a discrete-time period rather than a continuous time period when sampling the modulated signal input. The discrete-time period makes it possible to use a plurality of circuitry, such as switched capacitor and analog circuits. Those skilled in the art will understand that the period is not limited to discrete-time, other measurements of time, such as continuous time, may be used.

Another aspect of the present invention is that the FM demodulator further includes an oversampling of the input signals to obtain robust performance in the presence of noise.

Another aspect of the present invention is that the FM demodulator further includes the elimination of a low amplitude signal to reduce the sensitivity to noise in the in-phase and the quadrature signals.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

Modulation issues such as spectral efficiency, power efficiency, and bit error performance in the presence of multipath, noise, and interference are critical in the design of a radio link. Higher data rates for multimedia applications require more spectrum at a fixed modulation and coding. The robustness of the modulation and demodulation schemes to multipath, noise, and interference defines its attractiveness for use over radio channels.

In a time division duplex (TDD) transceiver system, the transmitter and receiver are never on simultaneously. In operation, data is bursted by the RF transmitter at more than twice the rate of the continuous input data to be transmitted for less than half the time. The far end receiver stores up the bursted data to be read out of a memory at a slower continuous pace.

The RF medium, however, typically introduces errors that occur in bursts, that is, intervals with high bit error rates (BER) in the channel are interspersed with intervals of a low BER. This FM demodulator circuit will enhance the performance of the system with that of the theoretical predictions for an ideal demodulator.

Figure 1:
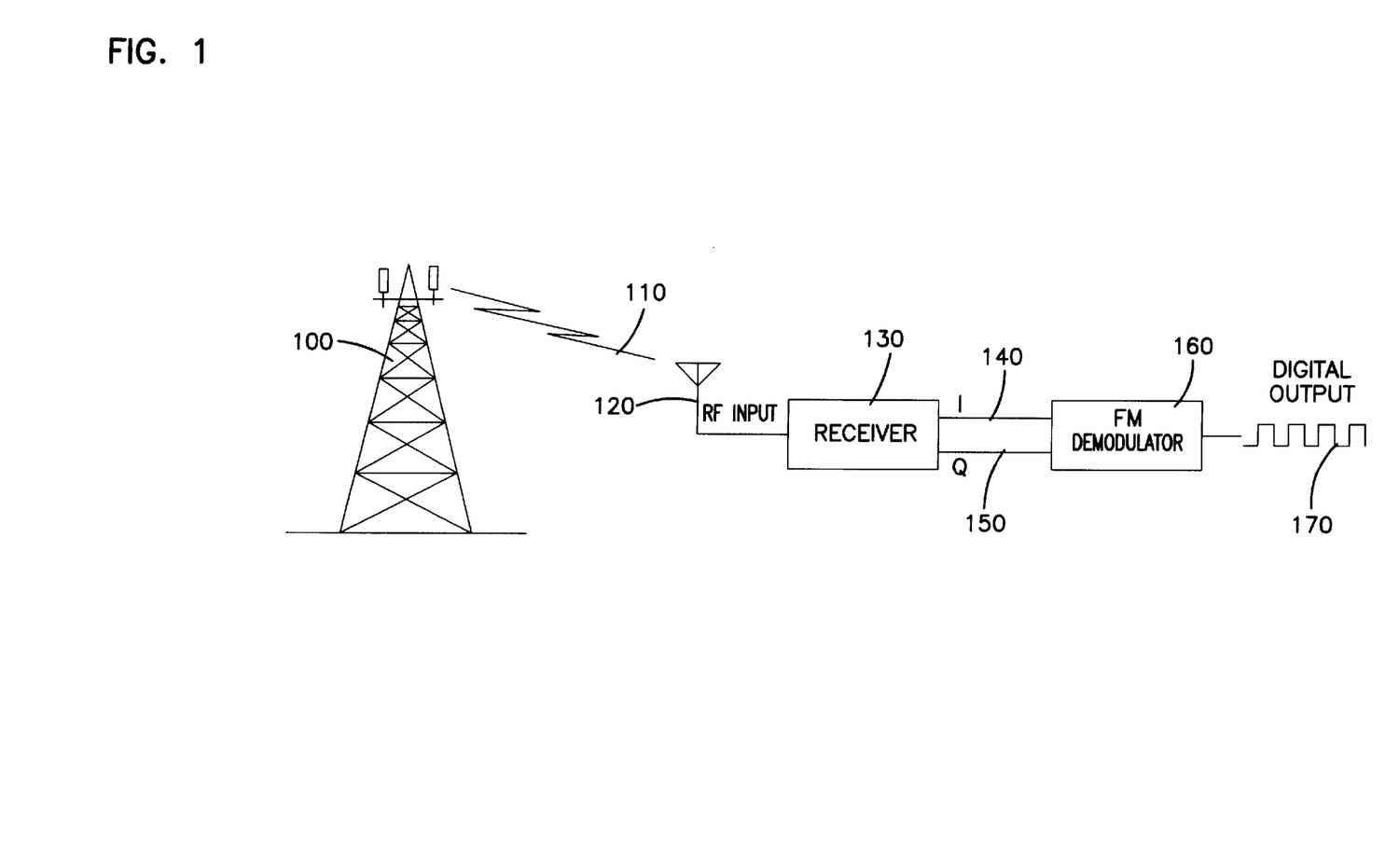
FIG. 1 is an exemplary diagram showing the FM demodulator in a typical radio receiver system.

FIG. 1 is an exemplary diagram showing the FM demodulator in a typical radio receiver system. An RF signal 110 may be transmitted from a station 100 to another station 120 in a receiver system 130. The outputs from the receiver system are the input signals to the FM demodulator 160. The input signals comprise of an in-phase (I) signal 140 and a quadrature (Q) signal 150. The demodulated output from the FM demodulator is a digital waveform 170.

Figure 2:
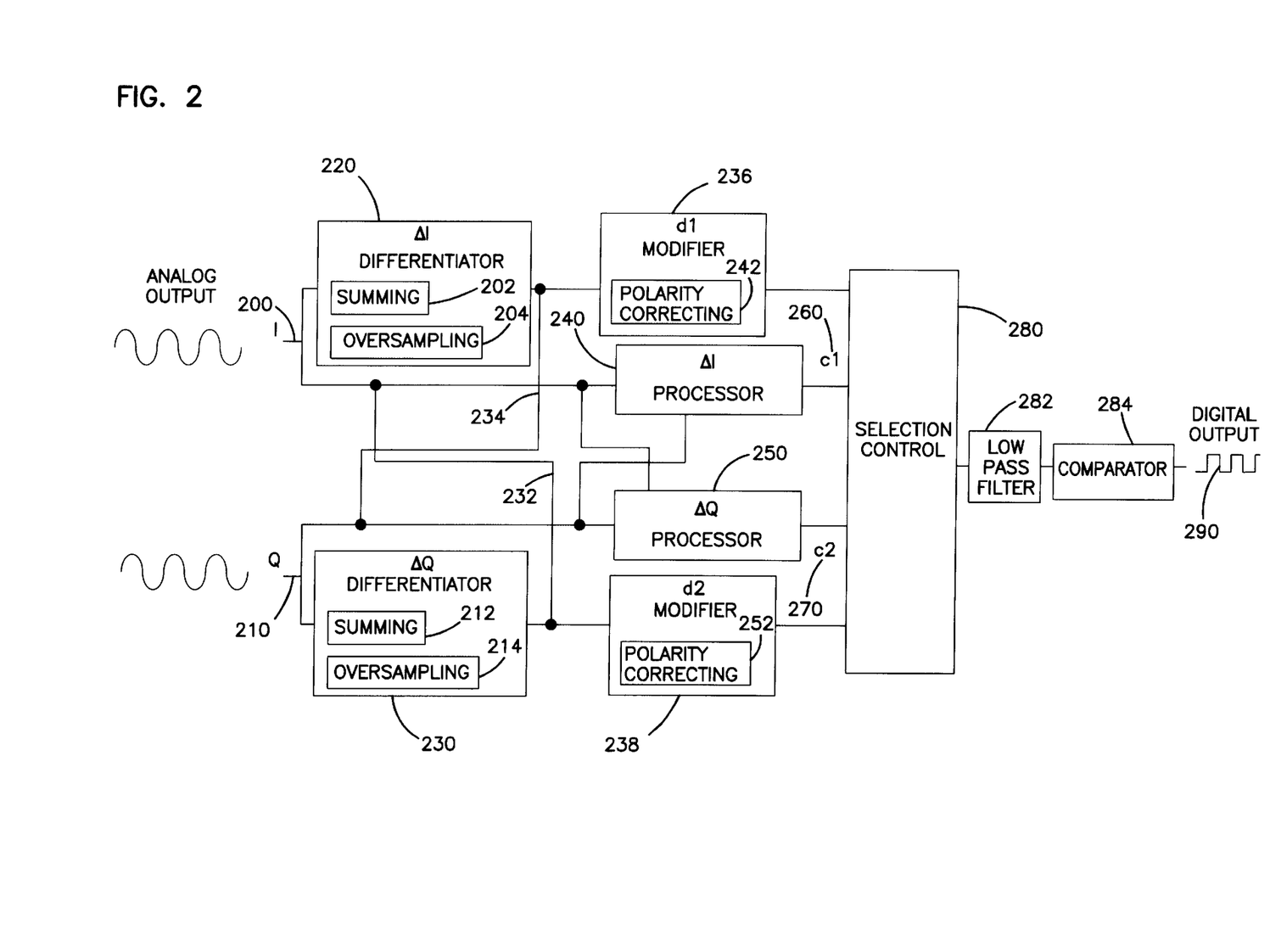
FIG. 2 is a block diagram of an FM demodulator circuit.

FIG. 2 is a block diagram of an FM demodulator circuit. The demodulator includes an in-phase (I) 200 baseband analog signal input and a quadrature (Q) 210 baseband analog signal input. The in-phase oversampling circuit 204 and the quadrature oversampling circuit 214 are used to oversample the in-phase and the quadrature input signals, respectively, by a predetermined factor with respect to the data rate. The data is sampled using a predetermined time period.

The in-phase signal 200 is differentiated 220 by computing the difference between the current value of the in-phase signal 200 and the value delayed by one clock period. The in-phase summing circuit 202 is used to perform this computation. The quadrature signal 210 is differentiated 230 by computing the difference between the current value of the quadrature signal 210 and the value delayed by one clock period. The quadrature summing circuit 212 is used to perform this computation.

To ensure the polarity of the output signal 290 is correct, the signs of the differentiated in-phase signal 220 and the differentiated quadrature signal 230 may be modified by an in-phase polarity correcting circuit 242 and a quadratrure polarity correcting circuit 252, respectively. The modification of the differentiated value of the in-phase signal 220 is accomplished by multiplying the sign of the quadrature signal 232 with the differentiated value of the in-phase signal 220 resulting in a signal d1 236. Mathematically, this is represented by:

$$d1 = sgn(Q) \times \Delta I \quad [1]$$

The modification of the differentiated value of the quadrature signal 230 is accomplished by multiplying the sign of the in-phase signal 234 with the differentiated value of the quadrature signal 230 resulting in a signal d2 238. Mathematically, this is represented by:

$$d2 = -sgn(I) \times \Delta Q \quad [2]$$

To reduce the sensitivity to noise in the in-phase signal and the quadrature signal, a comparison between the amplitude of the in-phase signal 240 and the amplitude of the quadrature signal 250 is performed, which results in c1 260 and c2 270 respectively. The selection control block 280 makes a decision on which signals will be utilized based on the resulting signals d1 236, d2 238, c1 260, and c2 270. The demodulator produces the receive digital data 290. A low pass filter 282 follows the selection control block 280. The low noise filter 282 reduces the demodulator's sensitivity to noise. The signal is sliced by a comparator 284 to recover the transmitted bits.

Figure 3:
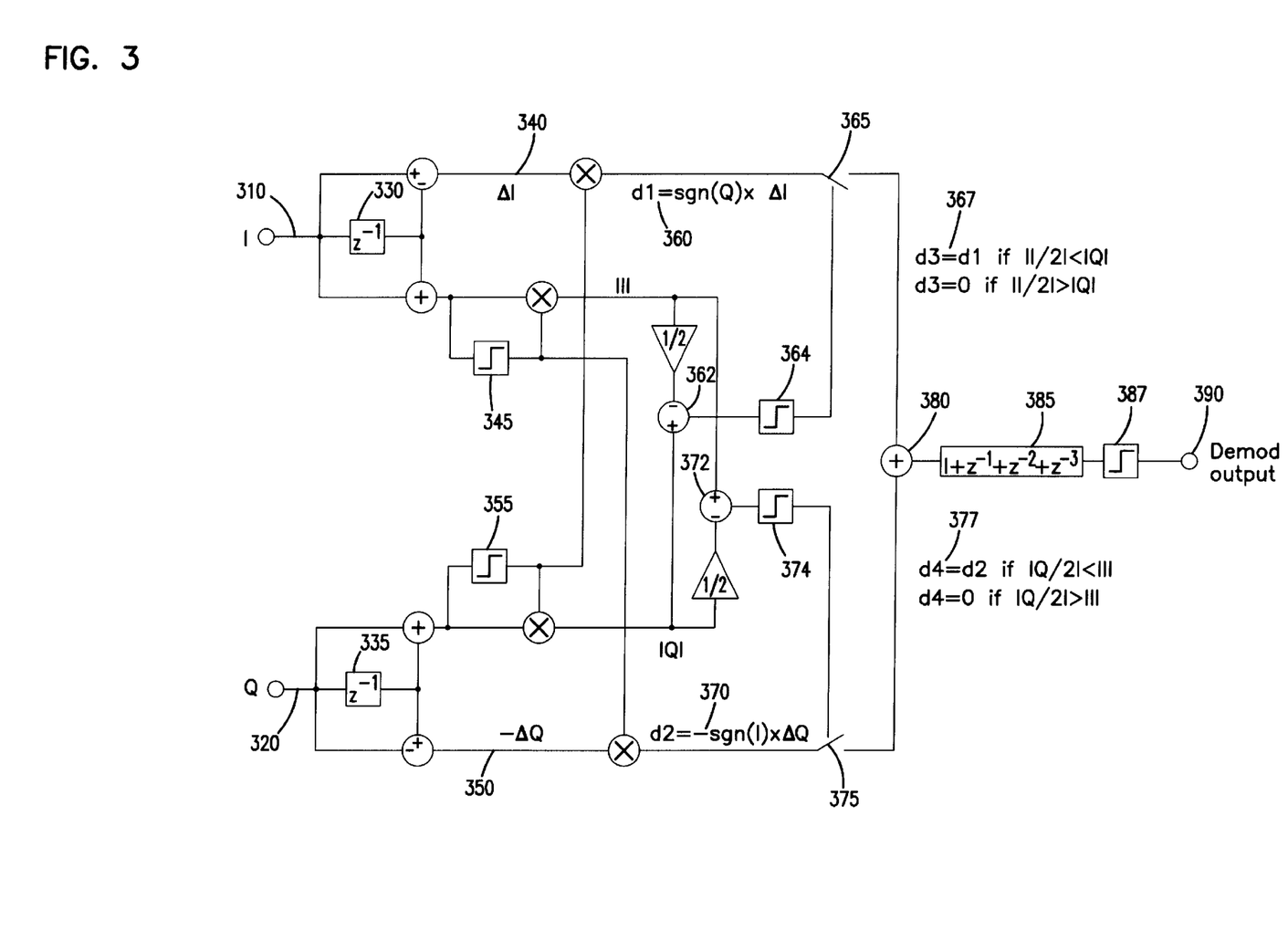
FIG. 3 illustrates in greater detail the FM demodulator.

FIG. 3 illustrates in greater detail the architecture of the FM demodulator used in a transceiver system. The in-phase signal 310 and the quadrature signal 320 are routed through a time sampling detector for a binary frequency shift key modulated input signal, wherein a discrete-time period rather than a continuous time period is used. The in-phase baseband signal 310 and the quadrature baseband signal 320 have been oversampled by a predetermined factor with respect to the data rate. Those skilled in the art understand that the oversampling factor above is not limited to a finite number. The demodulator differentiates the in-phase signal 310 by computing the difference between the current value of the in-phase signal 310 and the value of the signal delayed by one clock cycle 330. The result is a differentiated in-phase signal ($\Delta I$) 340.

Further, the demodulator differentiates the quadrature signal 320 by computing the difference between the current negative value of the quadrature signal 320 and the value of the signal delayed by one clock cycle 335. The result is a differentiated quadrature signal ($-\Delta Q$) 350. The sign of the differentiated in-phase signal 340 and differentiated quadrature signal 350 is modified depending on the sign of the quadrature signal 355 and the in-phase signal 345, respectively. The resulting modified differentiated in-phase signal and modified differentiated quadrature signal create d1 360 and d2 370, respectively.

Mathematically, this may be represented by Equation [1] and Equation [2], respectively. This change in the polarity of the differentiated signals insures that the subsequent addition of d1 360 and d2 370 results in a proper output. To reduce the sensitivity to noise in the in-phase signal 310 and the quadrature signal 320, a comparison 364, 374 between the amplitude of in-phase signal 362 and the amplitude of the quadrature signal 372 is performed and the smaller of the modified differentiated in-phase or quadrature signal is discarded. This switching for the selection function is represented by 367, 377:

$$d3 = d1 \text{ if } |I/2| < |Q| \quad [3]$$

or $$d3 = 0 \text{ if } |I/2| > |Q| \quad [4]$$

and $$d4 = d2 \text{ if } |Q/2| < |I| \quad [5]$$

or $$d4 = d0 \text{ if } |Q/2| > |I| \quad [6]$$

The resulting signals are added 380, then the signal is low pass filtered 385 by a 4-tap delay line and then sliced by a comparator 387 to recover the transmitted bit. Digital data 390 is produced as an output of the demodulator.

Figure 4:
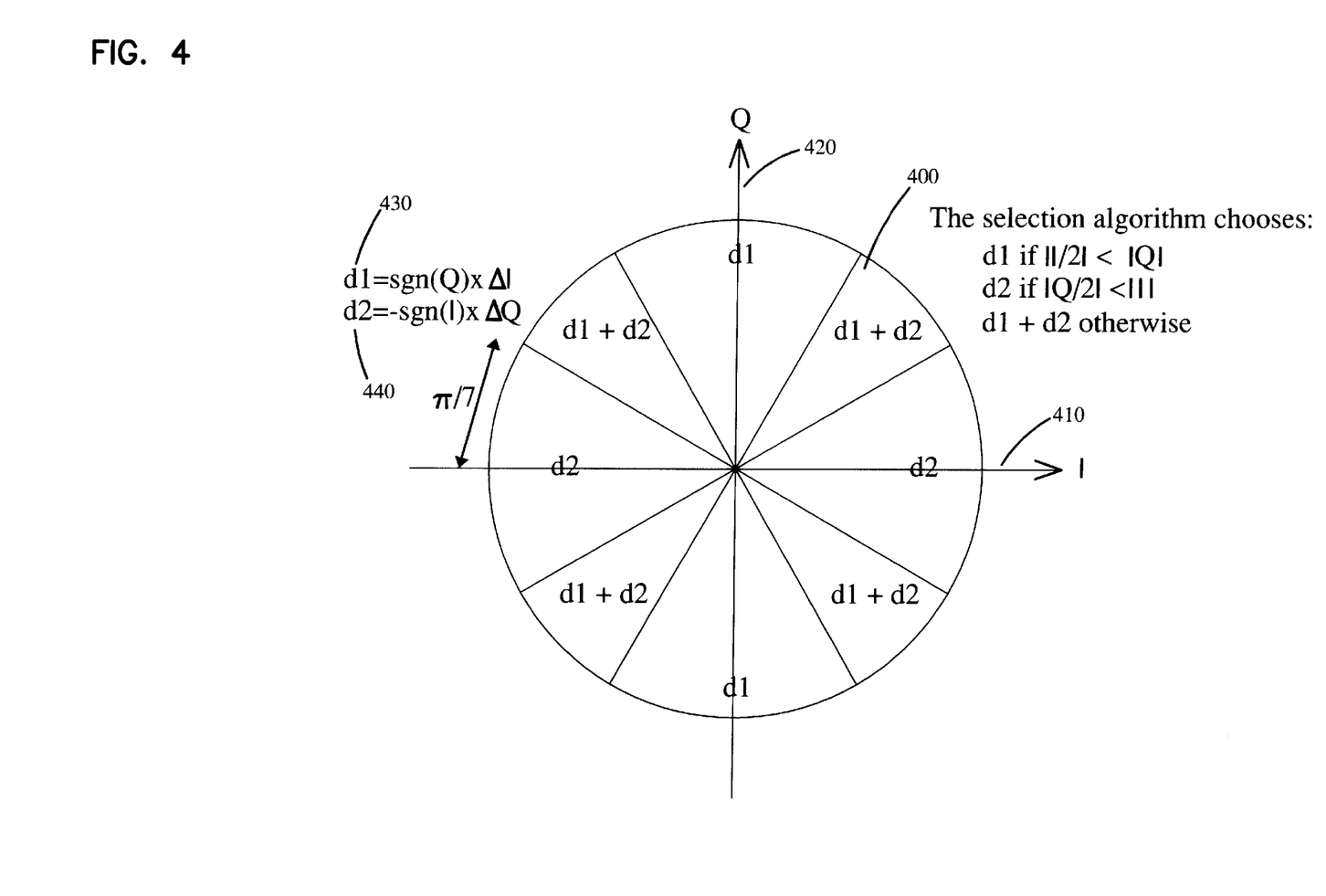
FIG. 4 is a diagrammatic representation of a signal constellation.

FIG. 4 is a diagrammatic representation of a signal constellation. To achieve higher bit rates in a fixed spectrum bandwidth, multilevel modulation and demodulation schemes are used. The four-level, or quadrature implementations are used to provide bandwidth efficiency and low bit energy to noise energy ratio requirement for error probability performance. The complex signal can be drawn using an in-phase (I) 410 and a quadrature (Q) 420 branch representing the orthogonal cosine and sine terms in the transmitted signal. The mapping of the two possible states is represented by the direction of rotation around the signal constellation 400, clockwise or counterclockwise. The implementation of the signal constellation reduces the sensitivity to noise in the in-phase and the quadrature input signals. The reduction of noise sensitivity in the in-phase and the quadrature signals is accomplished by comparing the amplitude of an in-phase input channel to a quadrature input channel. The differentiated lower amplitude signal is discarded rather than summed with the higher amplitude channel. A function of the signal constellation comprises ensuring that the subsequent addition of d1 430 and d2 440 result in a positive output if a signal constellation 400 has rotated clockwise, and in a negative output if the signal constellation 400 has rotated counterclockwise, regardless of the quadrant in which the constellation happens to be in. Mathematically, this is how the signal constellation chooses:

$$d1 \text{ if } |I/2|<|Q| \qquad [7]$$

$$d2 \text{ if } |Q/2|<|I| \qquad [8]$$

$$d1+d2 \text{ otherwise} \qquad [9]$$

Note that the absolute value of the in-phase (I) and the quadrature (Q) signal divided by two, in equations 3 through 9, is approximately equal to multiplying the result of the absolute value of the in-phase (I) and the quadrature (Q) signal by the tan ($\pi/7$). The value, $\pi/7$, is shown in FIG. 4 as the signal constellation's rotational interval.

Figure 5:
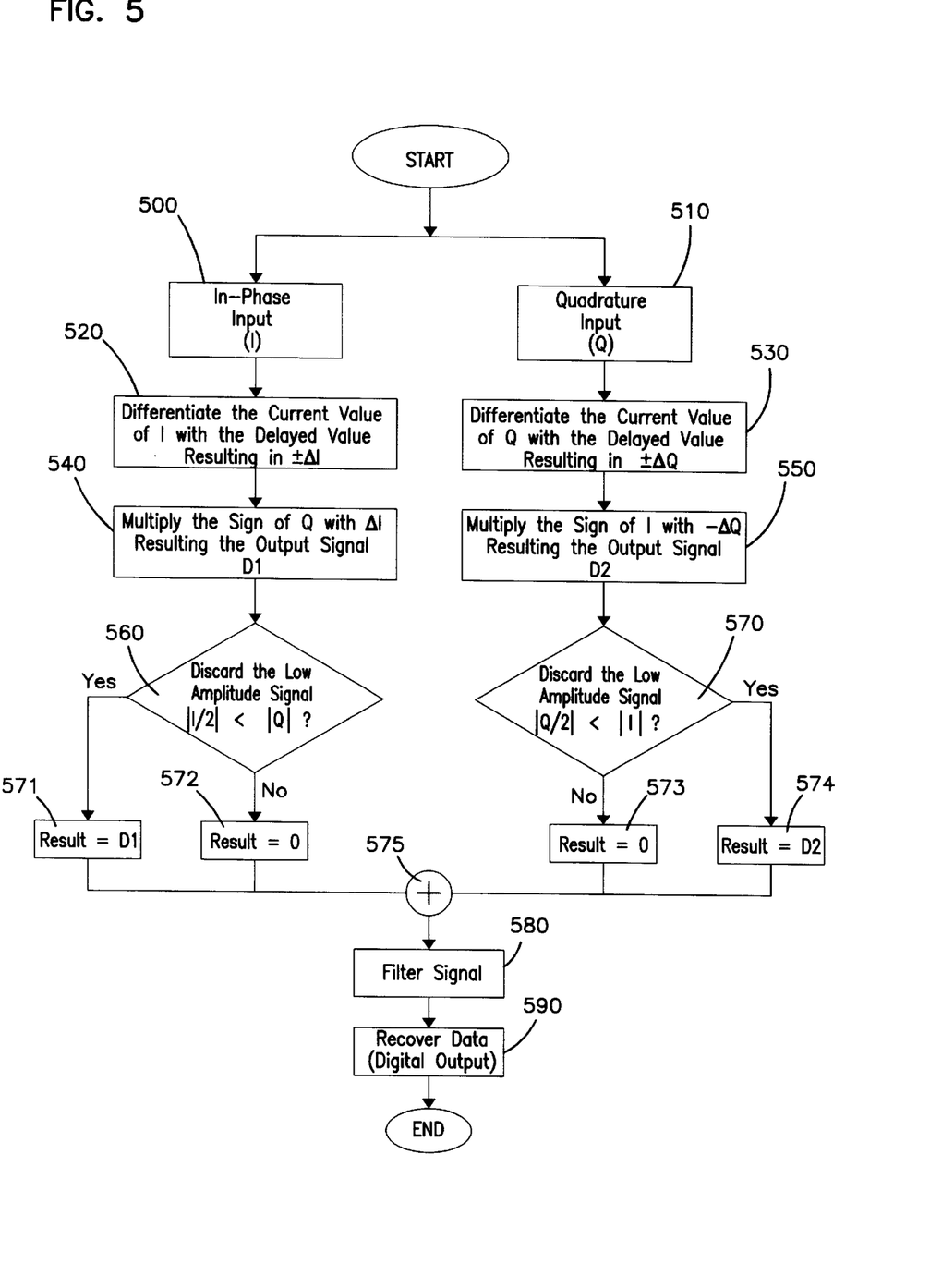
FIG. 5 is a flow diagram illustrating method of FM demodulation according to the present invention.

FIG. 5 is a flow diagram illustrating method of performing FM demodulation according to the present invention. The in-phase 500 and the quadrature 510 signals enter the demodulator as baseband signals. The difference between the current value of the in-phase signal 500 and the value of the in-phase signal delayed by one clock cycle is calculated and the result is a differentiated in-phase signal ($\pm\Delta I$) 520. The difference between the current value of the quadrature signal 510 and the value of the quadrature signal delayed by one clock cycle is calculated and the result is a differentiated quadrature signal ($\pm\Delta Q$) 530. After multiplying the sign of the quadrature signal ($\pm\Delta Q$) with differentiated in-phase signal ($\Delta I$) 540 and the sign of the in-phase signal with the negative of the differentiated quadrature signal ($-\Delta Q$) 550, a decision is made as to what value of the in-phase signal and the quadrature signal 571, 572, 573, 574 will be added together 575 to produce a non-filtered output signal. This signal is passed through a filter 580 and sliced by a comparator to recover the data in a digital form 590.

Figure 6:
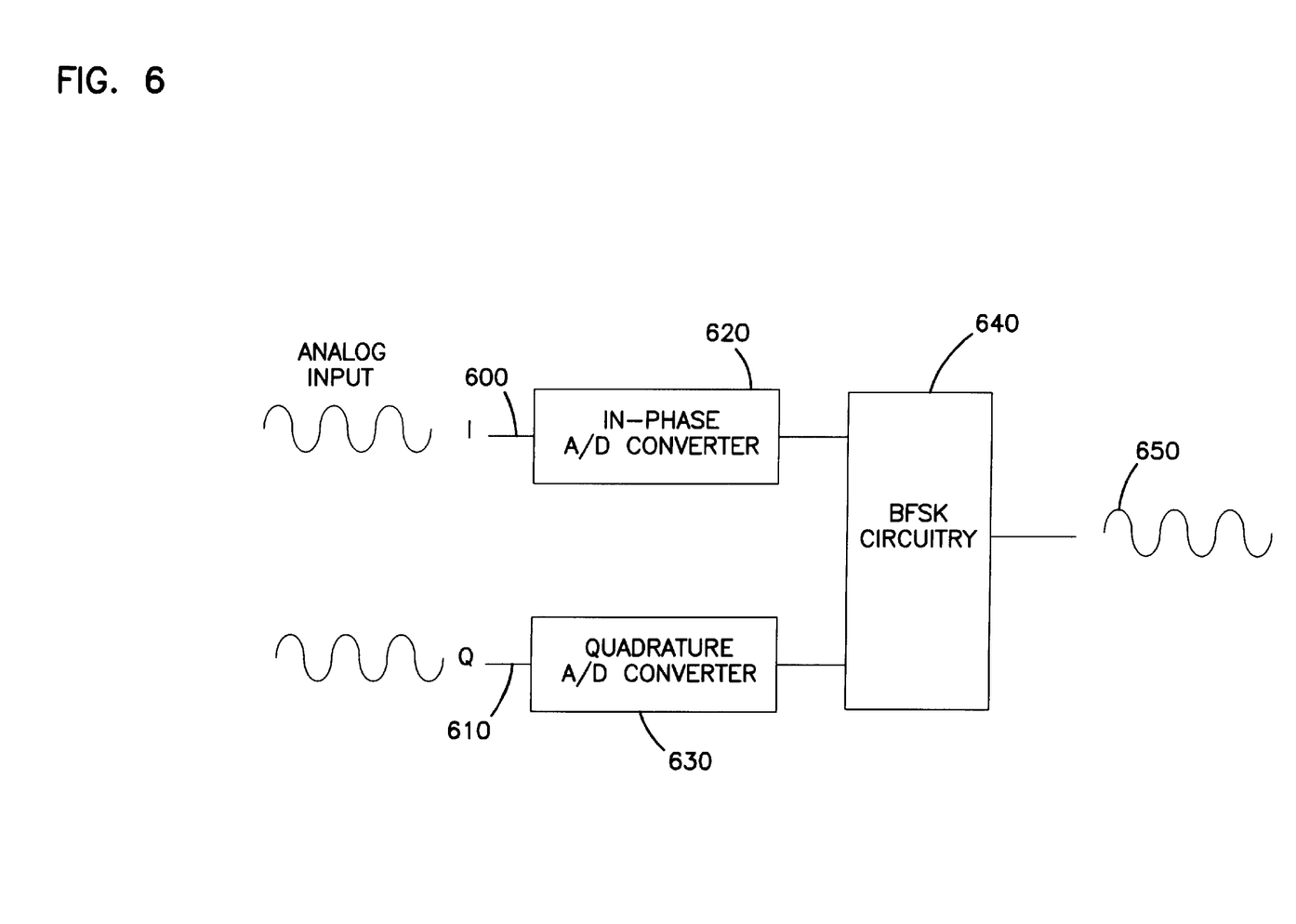
FIG. 6 is a digital representation of an FM demodulator circuit.

FIG. 6 is a digital representation of an FM demodulator circuit. The in-phase signal 600 and the quadrature 610 input signals are routed through an in-phase analog-to-digital converter 620 and a quadrature analog-to-digital converter 630, respectively. The digital forms of the in-phase and quadrature signals are routed to a binary frequency shift key (BFSK) circuit 640. Those skilled in the art will understand that the binary frequency shift key circuitry 640 can include a digital signal processor (DSP) which implements the functionality similar to FIG. 2 and FIG. 3. The output of the binary frequency shift key circuitry 640 is an analog waveform 650.

In summary, the FM demodulator circuit architecture according to the present invention provides reduced sensitivity to noise and enhances the performance of a system with that of the theoretical predictions for an ideal demodulator.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of demodulating signals from a source, comprising:

differentiating an in-phase signal and a quadrature signal to produce a differentiated value of the in-phase signal and a differentiated value of the quadrature signal;

oversampling the in-phase and the quadrature signals by a predetermined factor with respect to data rate, wherein data is sampled using a predetermined time period;

modifying a sign for the differentiated values of the in-phase and the quadrature signals based on the sign of the quadrature and in-phase signals respectively to produce modified values of the differentiated in-phase and quadrature signals;

processing the modified differentiated in-phase and quadrature values to produce an output, wherein sensitivity to noise is reduced by discarding a smaller of the modified differentiated in-phase or quadrature signal; and the oversampling of the in-phase and the quadrature signals comprising reducing sensitivity to noise by implementing the predetermined time period allowing use of a plurality of circuitry.

2. The method of claim 1, wherein differentiating the in-phase and the quadrature signal further comprises computing the difference between a current value of the in-phase and quadrature signal and the in-phase and quadrature signal delayed by a clock cycle.

3. The method of claim 1, wherein reducing the sensitivity to noise comprises implementing a discrete-time period allowing the use of a switched capacitor circuit.

4. The method of claim 3, wherein the modified differentiated low amplitude signal is discarded.

5. The method of claim 4, wherein discarding the differentiated low amplitude signal further comprises selecting the value of the modified differentiated in-phase signal when the quadrature signal is less than a predetermined amount relative to the in-phase signal, selecting the value of the modified differentiated quadrature signal when the in-phase signal is less than a predetermined amount relative to the quadrature signal, and selecting the value of the modified differentiated in-phase signal plus the value of the modified differentiated quadrature signal otherwise.

6. The method of claim 1, wherein the modified differentiated in-phase and quadrature signals provide the correct signal polarity for the output.

7. The method of claim 1 further comprises filtering the output signal to exclude frequencies above a certain point and allowing all other frequencies to pass.

8. The method of claim 1 further comprises sensing the output signal polarity and recovering transmitted bits in response thereto.

9. A demodulator circuit for receiving multiple signals from a source, comprising:

a differentiator circuit for differentiating an in-phase signal and a quadrature signal to produce a differentiated value of the in-phase signal and a differentiated value of the quadrature signal, the differentiator circuit including an oversampling circuit to oversample the in-phase and the quadrature signals by a predetermined factor with respect to data rate wherein data is sampled using a predetermined time period;

a modifier circuit, coupled to the differentiator circuit, for modifying a sign of the differentiated values of the in-phase and the quadrature signals based on the sign of the quadrature and the in-phase signals respectively to produce modified values of the differentiated in-phase and quadrature signals;

a processor, coupled to the modifier circuit, for processing the modified differentiated in-phase and quadrature values to produce an output, wherein sensitivity to noise is reduced by discarding a smaller of the modified differentiated in-phase or quadrature signal; and wherein the oversampling circuit reduces the sensitivity to noise by using the predetermined time period allowing use of a plurality of circuitry.

10. The demodulator circuit of claim 9, wherein the differentiator circuit further comprises a summing circuit for computing the difference between a current value of the in-phase and the quadrature signals and the value of the in-phase and the quadrature signals delayed by a clock cycle.

11. The demodulator circuit of claim 9, wherein using the predetermined time period reduces the sensitivity to noise by implementing a discrete-time period allowing the use of switched capacitor circuit.

12. The demodulator of claim 11, wherein the modified differentiated low amplitude signal is discarded.

13. The demodulator circuit claim 12, wherein the oversampling circuit selects the value of the modified differentiated in-phase signal when the quadrature signal is less than a predetermined amount relative to the in-phase signal, selects the value of the modified differentiated quadrature signal when the in-phase signal is less than a predetermined amount relative to the quadrature signal, and selects the value of the modified differentiated in-phase signal plus the value of the modified differentiated quadrature signal otherwise.

14. The demodulator circuit of claim 9, wherein the modifier circuit further comprises a polarity correcting circuit to provide the correct signal polarity for the output.

15. The demodulator circuit of claim 9 further comprising a low pass filter, coupled to the modifier circuit, for excluding frequencies above a certain point and allowing all other frequencies to pass.

16. The demodulator circuit of claim 15 further comprising a comparator, coupled to the low pass filter, for sensing an output signal polarity and recovering transmitted bits in response thereto.

17. A system for receiving a modulated signal and recovering information, comprising:
an antenna to receive a propagated signal;
a receiver to filter and amplify the propagated signal to produce an in-phase and a quadrature baseband component of the propagated signal;
a demodulator to recover information from the in-phase and the quadrature baseband components of the propagated signal and to generate a digital output in response thereto; wherein the demodulator comprises:
a differentiator circuit for differentiating an in-phase signal and a quadrature signal to produce a differentiated value of the in-phase signal and a differentiated value of the quadrature signal, the differentiator circuit including an oversampling circuit to oversample the in-phase and the quadrature signals by a predetermined factor with respect to data rate, wherein data is sampled using a predetermined time period;
a modifier circuit for modifying a sign of the differentiated values of the in-phase and the quadrature signals based on the sign of the quadrature and the in-phase signals respectively to produce modified values of the differentiated in-phase and quadrature signals;
a processor for processing the modified differentiated in-phase and quadrature values to produce an output, wherein sensitivity to noise is reduced by discarding a smaller of the modified differentiated in-phase or quadrature signal and
wherein the oversampling circuit reduces sensitivity to noise by using the predetermined time period allowing use of a plurality of circuitry.

18. The system of claim 17, wherein the differentiator circuit further comprises a summing circuit for computing the difference between a current value of the in-phase and the quadrature signals and the value of the in-phase and quadrature the signals delayed by a clock cycle.

19. The system of claim 17, wherein the predetermined time period reduces the sensitivity to noise by using a discrete-time period allowing the use of a switched capacitor circuit.

20. The system of claim 19, wherein the modified differentiated low amplitude signal is discarded.

21. The system of claim 20, wherein the oversampling circuit selects the value of the modified differentiated in-phase signal when the quadrature signal is less than a predetermined amount relative to the in-phase signal, selects the value of the modified differentiated quadrature signal when the in-phase signal is less than a predetermined amount relative to the quadrature signal, and selects the value of the modified differentiated in-phase signal plus the value of the modified differentiated quadrature signal otherwise.

22. The system of claim 17, wherein the modifier circuit further comprises a polarity correcting circuit to provide the correct signal polarity for the output.

23. The system of claim 17 further comprising a low pass filter, coupled to the modifier circuit, for excluding frequencies above a certain point and allowing all other frequencies to pass.

24. The system of claim 23 further comprising a comparator, coupled to the low pass filter, for sensing an output signal polarity and recovering transmitted bits in response thereto.

* * * * *